(12) United States Patent
Song et al.

(10) Patent No.: US 6,906,457 B2
(45) Date of Patent: Jun. 14, 2005

(54) ORGANIC ELECTROLUMINESCENT DEVICE

(75) Inventors: Young Woo Song, Suwon (KR); Hitoshi Yamamoto, Seongnam (KR); Takeo Wakimoto, Ulsan (KR); Chang Hee Ko, Seoul (KR)

(73) Assignee: Samsung SDI Co., Ltd., Suwon-si (KR)

( * ) Notice: Subject to any disclaimer, the term of this patent is extended or adjusted under 35 U.S.C. 154(b) by 219 days.

(21) Appl. No.: 10/320,546

(22) Filed: Dec. 17, 2002

(65) Prior Publication Data

US 2003/0122481 A1 Jul. 3, 2003

(30) Foreign Application Priority Data

Dec. 17, 2001 (KR) .................................. 2001-0080127

(51) Int. Cl.⁷ .................................................. H01J 1/62
(52) U.S. Cl. ........................................ 313/504; 313/506
(58) Field of Search ................................ 313/498, 501, 313/504, 506, 512

(56) References Cited

FOREIGN PATENT DOCUMENTS

| JP | 4-137485 | 5/1992 |
| JP | 4-328295 | 11/1992 |
| JP | 7-240277 | 9/1995 |

*Primary Examiner*—Vip Patel
(74) *Attorney, Agent, or Firm*—Stein, McEwen & Bui, LLP

(57) ABSTRACT

An organic electroluminescent display (EL) device including a substrate, a transparent electrode, a hole transport layer, a light emitting layer, an electron transport layer and a cathode, sequentially stacked, wherein assuming that the sum of a geometric thickness of the electron transport layer, a geometric thickness of the light emitting layer is denoted by l1, the l1 with a maximum of luminance is denoted by a peak_l1, the sum of a geometric thickness of the hole transport layer and a geometric thickness of the transparent electrode is denoted by l2, the geometric thickness of the hole transport layer is denoted by d(HTL), the d(HTL) with a maximum or minimum of luminance is denoted by a peak_d(HTL), the l1 is set to have an maximum of luminance and l2 is set such that a thickness distribution according to colors of red, green and blue at the peak_l2 is within the range of 30 nm, respectively.

19 Claims, 4 Drawing Sheets

ORGANIC ELECTROLUMINESCENT DEVICE

CROSS REFERENCE TO RELATED APPLICATIONS

This application claims the benefit of Korean Application No. 2001-80127, filed Dec. 17, 2001, in the Korean Intellectual Property Office, the disclosure of which is incorporated herein by reference.

BACKGROUND OF THE INVENTION

1. Field of the Invention

The present invention relates to an organic electroluminescent (EL) device, and more particularly, to an organic EL device having a thickness of an organic film set so as to have a small difference in the luminance among red (R), green (G) and blue (B) lights depending on the change in thickness of the organic film.

2. Description of the Related Art

In general, conventional organic EL devices are of a self-emission type, and much attention has been paid thereto because they have advantageous features suitable for next generation devices, such as a wide viewing angle, a high contrast ratio and a high response speed.

EL devices are classified into inorganic EL devices and organic EL devices according to materials to form emitter layers. In particular, studies of organic EL devices have been briskly carried out because of their advantages, including good characteristics in terms of brightness, drive voltage, response speed, multi-color luminescence and so on.

An organic EL device is basically configured such that a positive electrode layer with a predetermined pattern is formed on a substrate. Then, a hole transport layer, a light emitting layer and an electron transport layer sequentially stacked on the positive electrode layer, and a negative electrode layer with a predetermined pattern is formed on the electron transport layer in a direction orthogonal to the positive electrode layer. Here, the hole transport layer, the light emitting layer and the electron transport layer are organic thin films made from organic compounds.

In the field of organic EL devices, many attempts to achieve the maximum emission efficiency and luminance have been made by controlling the thickness of the organic thin films. For example, Japanese Patent Laid-open Publication No. Hei 4-137485 discloses, in the construction consisting of a positive electrode, a hole transport layer, a light emitting layer, an electron transport layer and a negative layer sequentially stacked, a method to improve the emission efficiency by setting the thickness of the electron transport layer to be 30 to 60 nm. Also, Japanese Patent Laid-open Publication No. Hei 4-328295 discloses that the light luminance is substantially increased by mutual interference between the light generated from a light emitting layer and the light reflected from a cathode by adjusting the thickness of an electron transport layer. Japanese Patent Laid-open Publication No. Hei 7-240277 discloses an organic EL device with improved luminance, inter alia, color purity of blue emission by controlling the optical thickness of various layers.

Such organic EL devices are constructed such that optical thicknesses of the layers are varied according to color in order to increase the luminance, which is, however, quite difficult to achieve in actual mass production processes.

To solve the above problems, the optical thickness is adjusted to be suitable for a specific color that has rather poor characteristics. Thus, deterioration of the electro-optical characteristics of other colors cannot be avoided.

SUMMARY OF THE INVENTION

Accordingly, it is an object of the present invention to provide an electroluminescent (EL) device which has optical thicknesses or organic films set to optimize color distribution characteristics. In other words, in the case of a color whose optical thickness is optimized in consideration of optical interference, there is no big difference in the color distribution characteristics even if the thickness of an organic thin film is changed due to a processing difference, while there is a big difference in the color distribution characteristics in the case of a color whose optical thickness is not optimized. Therefore, the present invention is directed toward reducing a difference in color distribution characteristics.

Additional objects and advantages of the invention will be set forth in part in the description which follows and, in part, will be obvious from the description, or may be learned by practice of the invention.

The foregoing and other objects of the present invention are achieved by providing an organic electroluminescent display (EL) device including a transparent substrate, a transparent electrode, a hole transport layer, a light emitting layer, an electron transport layer and a cathode, sequentially stacked, wherein assuming that the sum of a geometric thickness of the electron transport layer and a geometric thickness of the light emitting layer is denoted by l1, and the l1 with a maximum of luminance is denoted by a peak_l1, the l1 is set to have a maximum of luminance for each color, the peak_l1.

According to an aspect of the invention, the l1 of three primary colors of red, green and blue are a red peak_l1, a green peak_l1, and a blue peak_l1, respectively.

Also, assuming that the sum of an optical thickness of the electron transport layer and an optical thickness of the light emitting layer is denoted by L1, the optical thickness of the electron transport layer and the optical thickness of the light emitting layer are denoted by (nd)1 and (nd)2, respectively, and m is a positive integer inclusive of 0, $L1=(nd)1+(nd)2=(2m+1)\times\lambda/4$.

The foregoing and other objects of the present invention may also be achieved by providing an organic EL device including a transparent substrate, a transparent electrode, a hole transport layer, a light emitting layer, an electron transport layer and a cathode, sequentially stacked, wherein assuming that the sum of a geometric thickness of the hole transport layer and a geometric thickness of the transparent electrode is denoted by l2, the geometric thickness of the hole transport layer is denoted by d(HTL), and the d(HTL) with a maximum or minimum of luminance is denoted by a peak_d(HTL), and the l2 is set such that a thickness distribution according to colors of red, green and blue at the peak_d(HTL) is within the range of 30 nm.

Assuming that the peak_d(HTL) of three primary colors of red, green and blue are a red peak_d(HTL), a green peak_d(HTL), and a blue peak_d(HTL), respectively, the thickness distribution according to colors of red, green and blue at the peak_d(HTL) may correspond to a difference between the maximum and minimum values among the red peak_d(HTL), the green peak_d(HTL), and the blue peak_d(HTL).

Also, assuming that the sum of an optical thickness of the hole transport layer and an optical thickness of the transparent electrode is denoted by L2, the optical thickness of the hole transport layer and the optical thickness of the transparent electrode are denoted by (nd)3 and (nd)4, respectively, and m is a positive integer inclusive of 0, L2=(nd)3+(nd)4=(m+1)×λ/2.

The foregoing and other objects of the present invention may also be achieved by providing an organic EL device including a substrate, a transparent electrode, a hole transport layer, a light emitting layer, an electron transport layer and a cathode, sequentially stacked, wherein assuming that the sum of a geometric thickness of the electron transport layer and a geometric thickness of the light emitting layer is denoted by l1, the l1 with a maximum of luminance is denoted by a peak_l1, the sum of a geometric thickness of the hole transport layer and a geometric thickness of the transparent electrode is denoted by l2, the geometric thickness of the hole transport layer is denoted by d(HTL), and the d(HTL) with a maximum or minimum of luminance is denoted by a peak_d(HTL), the l1 is set such that each color has a maximum of luminance and the l2 is set such that a thickness distribution according to colors of red, green and blue at peak_d(HTL) is within the range of 30 nm, respectively.

The peak_l1 of three primary colors of red, green and blue are a red peak_l1, a green peak_l1, and a blue peak_l1, respectively, and assuming that the peak_d(HTL) of three primary colors of red, green and blue are a red peak_d(HTL), a green peak_d(HTL), and a blue peak_d (HTL), respectively, the thickness distribution according to colors of red, green and blue at the peak_d(HTL) may correspond to a difference between the maximum and minimum values among the red peak_d(HTL), the green peak_d(HTL) and the blue peak_d(HTL).

Also, assuming that the sum of an optical thickness of the electron transport layer and an optical thickness of the light emitting layer is denoted by L1, the optical thickness of the electron transport layer is denoted by (nd)1, the optical thickness of the light emitting layer is denoted by (nd)2, the sum of an optical thickness of the hole transport layer and an optical thickness of the transparent electrode is denoted by L2, the optical thickness of the hole transport layer is denoted by (nd)3, the optical thickness of the transparent electrode is denoted by (nd)4, and m is a positive integer inclusive of 0, L1=(nd)1+(nd)2=(2m+1)×λ/4 and L2=(nd)3+(nd)4=(m+1)×λ/2.

BRIEF DESCRIPTION OF THE DRAWINGS

These and other objects and advantages of the invention will become apparent and more readily appreciated from the following description of the embodiments, taken in conjunction with the accompanying drawings of which:

FIGS. 3A through 3F illustrate changes in luminance by three primary colors of red (R), green (G) and blue (B) depending on a change in the geometric thickness of a hole transport layer of an organic EL device according to another embodiment of the present invention.

DETAILED DESCRIPTION OF THE INVENTION

Figure 1:
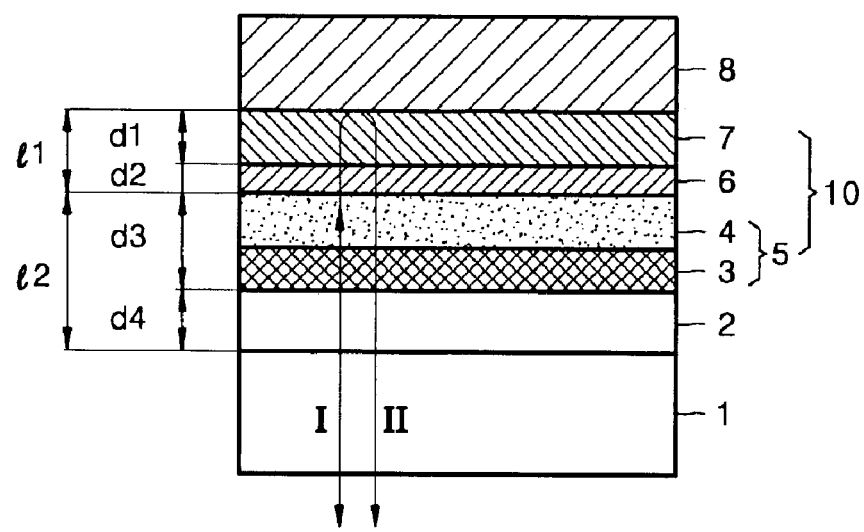
FIG. 1 is a cross-sectional view of an organic EL device according to an embodiment of the present invention.

Reference will now be made in detail to the embodiments of the present invention, examples of which are illustrated in the accompanying drawings, wherein like reference numerals refer to like elements throughout. The embodiments are described below in order to explain the present invention by referring to the figures.

Referring to FIG. 1, an organic EL device according to an embodiment of the present invention includes a substrate 1, a transparent electrode 2, a hole transport layer 5, a light emitting layer 6, an electron transport layer 7 and a cathode 8, sequentially stacked. The substrate 1 may be made from a transparent material. Usable examples of the substrate 1 include glass, quartz and organic polymer compounds and the like. Also, the transparent electrode 2 may be made from a transparent, dielectric material having a work function of at least 4 electron volts ("eV"), for example, ITO or IZO.

The transparent electrode 2 is formed on the substrate 1 in the form of a thin film by depositing or sputtering the transparent material. Various known materials are usable as materials of the hole transport layer 5, the light emitting layer 6 and an organic electron transport layer 7.

The hole transport layer 5 includes a hole transport layer (HTL) 4 and a hole injection layer (HIL) 3. The cathode 8 may be made from metals, alloys and electrically conductive compounds having a low work function of less than about 4 eV. For example, the metals are exemplified by sodium, magnesium, aluminum, lithium and so on. The cathode 8 is formed on the electron transporting layer (ETL) 8 in the form of a thin film by depositing or sputtering the metals.

As illustrated in FIG. 1, assuming that the sum of a geometric thickness of the electron transport layer 7 and a geometric thickness of the light emitting layer 6 is denoted by l1, the geometric thickness of the electron transport layer 7 and the geometric thickness of the light emitting layer 6 are denoted by d(ETL) and d(EML), respectively, the sum of an optical thickness of the electron transport layer 7 and an optical thickness of the light emitting layer 6 is denoted by L1, the optical thickness of the electron transport layer 7 and the optical thickness of the light emitting layer 6 are denoted by (nd)1 and (nd)2, respectively, $$L1=(nd)1+(nd)2$$

wherein (nd)1 is the product of the geometric thickness of the electron transport layer 7, i.e., d(ETL), and the refractive index thereof, i.e., n1, and (nd)2 is the product of the geometric thickness of the light emitting layer 6, i.e., d(EML), and the refractive index thereof, i.e., n2.

When the relationship L1=(2m+1)×λ/4 (m is a positive integer inclusive of 0) exists, constructive interference occurs between the light generated from the light emitting layer 6 and transmitted to the substrate 1 and the light generated from the light emitting layer 6 and reflected from the cathode 8, and a maximum of luminance is met.

Figure 2:
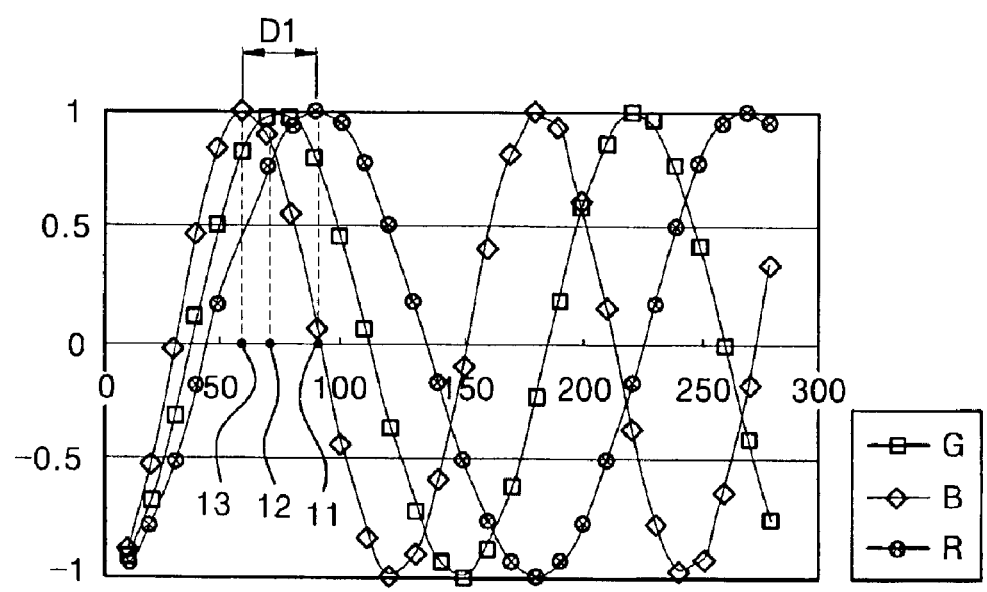
FIG. 2 illustrates changes in luminance by three primary colors of red (R), green (G) and blue (B) depending on a change in the total thickness of an electron transport layer and a light emitting layer of the organic EL device according to the embodiment of FIG. 1.

FIG. 2 is a graphical representation of changes in luminance depending on a change in l1, that is, the sum of a geometric thickness of the electron transport layer 7 and a geometric thickness of the light emitting layer 6, in consideration of only a first mode (I) and a second mode (II) among various modes of the light generated from the light emitting layer 6, assuming that reflectance from the cathode 8 and the reflectance between the transparent electrode 2 and the substrate 1 are largest.

During the first mode (I), the light generated from the light emitting layer 6 is transmitted through the substrate 1 without being reflected, and during the second mode (II), the light generated from the light emitting layer 6 is reflected once.

The ordinate denotes relative values of luminance and the abscissa denotes l1, that is, the sum of a geometric thickness of the electron transport layer 7 and a geometric thickness of the light emitting layer 6 of the organic EL device according to the embodiment of FIG. 1. FIG. 2 illustrates a change in luminance depending on a change in l1 according to the wavelengths of three primary colors, i.e., red (R) with a center wavelength ranging from 600 nm to 650 nm, green (G) with a center wavelength ranging from 500 nm to 550 nm, and blue (B) with a center wavelength ranging from 440 nm to 490 nm.). Table 1 shows the refractive index of an organic thin film 10, the refractive index of a transparent electrode 2 made from ITO, and the refractive index of a substrate 1 made from glass.

TABLE 1

|  | Blue | Green | Red |
|---|---|---|---|
| Wavelength (nm) | 450 | 530 | 620 |
| Refractive index of organic thin film | 1.85 | 1.75 | 1.72 |
| Refractive index of ITO | 2.01 | 1.93 | 1.76 |
| Refractive index of substrate | 1.525 | 1.52 | 1.515 |

Let the l1 with a maximum of luminance be a peak_l1, the peak_l1 of each of three primary colors of red, green and blue be a red peak_l1 (11), a green peak_l1 (12), and a blue peak_l1 (13). Referring to FIG. 2, the l1 for each color is set to a red peak_l1 (11), a green peak_l1 (12), and a blue peak_l1 (13), respectively, so that a change in luminance depending on changes in thickness becomes a minimum for all of the three colors of red, green and blue.

As illustrated in FIG. 2, when the red peak_l1 (11), the green peak_l1 (12) and the blue peak_l1 (13) are 90 nm, 75 nm and 60 nm, respectively, constructive interference occurs to all colors of red, green and blue, so that the luminance of each color reaches a maximum value. Thus, even if there is a difference in l1, a difference in the luminance can be minimized for all colors of red, green and blue.

An organic EL device according to another embodiment of the present invention includes a substrate 1, a transparent electrode 2, a hole transport layer 5, a light emitting layer 6, an electron transport layer 7 and a cathode 8, sequentially stacked, as illustrated in FIG. 1.

Here, the same reference numerals as those shown in the above drawings denote substantially the same functional elements, and a detailed explanation thereof will not be given.

Assuming that the sum of a geometric thickness of the hole transport layer 5 and a geometric thickness of the transparent electrode 2 is denoted by l2, the geometric thickness of the hole transport layer 5 and the geometric thickness of the transparent electrode 2 are denoted by d(HTL) and d(ITO), respectively, the sum of an optical thickness of the hole transport layer 5 and an optical thickness of the transparent electrode 2 is denoted by L2, the optical thickness of the hole transport layer 5 and the optical thickness of the transparent electrode 2 are denoted by (nd)3 and (nd)4, respectively, $$L2=(nd)3+(nd)4$$

wherein (nd)3 is the product of the geometric thickness of the hole transport layer 5, i.e., d(HTL), and the refractive index thereof, i.e., n3, and (nd)4 is the product of the geometric thickness of the transparent electrode 2, i.e., d(ITO), and the refractive index thereof, i.e., n4.

When the relationship $L2=(m+1)\times\lambda/2$ (m is a positive integer inclusive of 0) exists, constructive interference occurs between the light generated from the light emitting layer 6 and transmitted to the substrate 1 and the light generated from the light emitting layer 6 and reflected from the boundary between the transparent electrode 2 and the substrate 1, and a maximum of luminance is met.

FIGS. 3A through 3F are graphical representations of changes in luminance depending on a change in d(HTL), that is, the geometric thickness of the hole transport layer 5, in consideration of only a first mode (I) and a second mode (II) among various modes of the light generated from the light emitting layer 6, in the event of reflectance from the boundary between the transparent electrode 2 and the substrate 1.

Figure 3A:
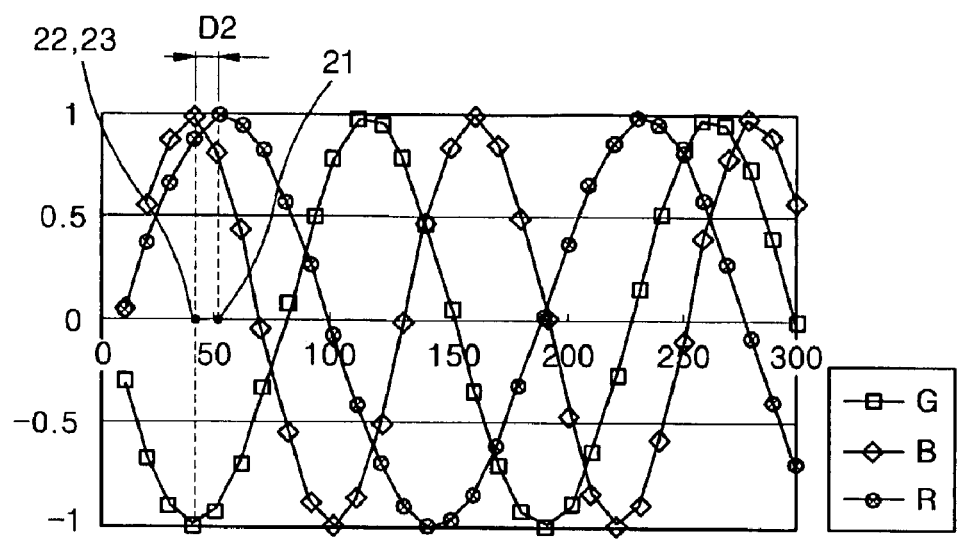
Figure 1:
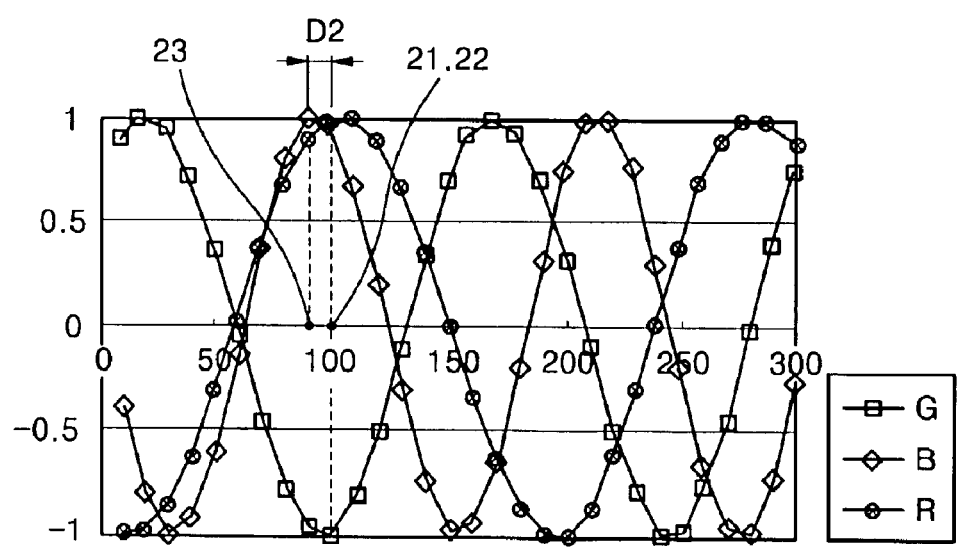
Figure 3C:
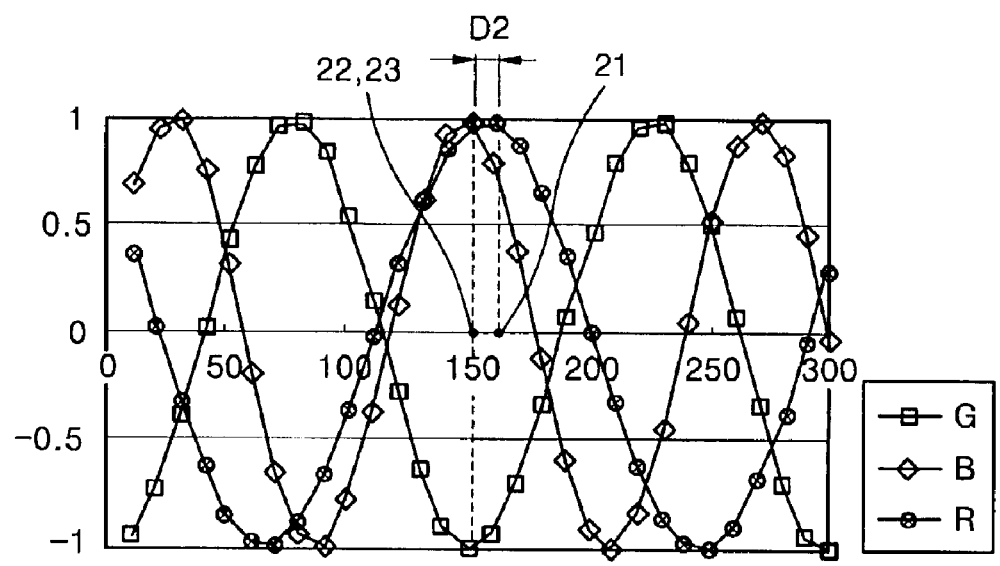
Figure 3D:
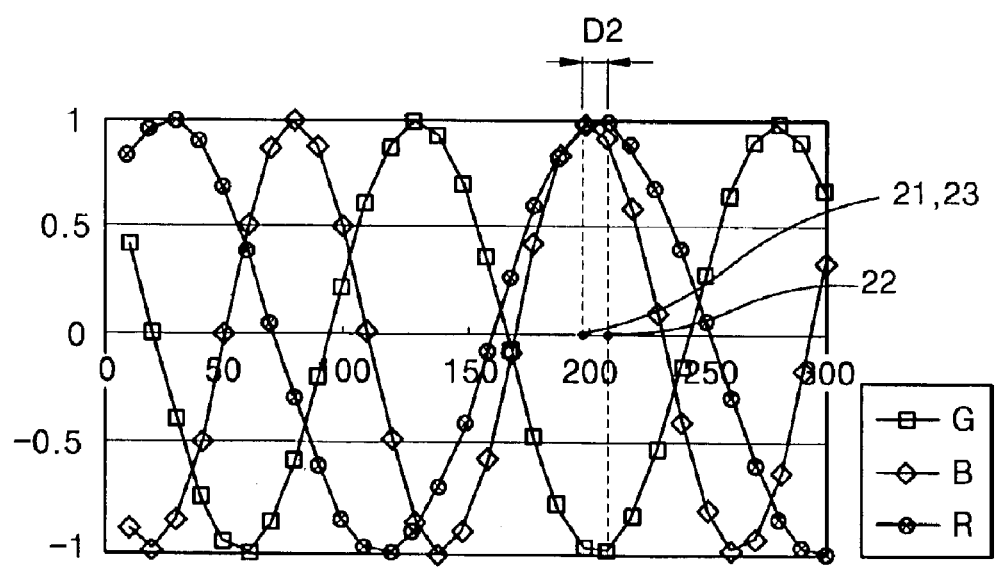
Figure 3E:
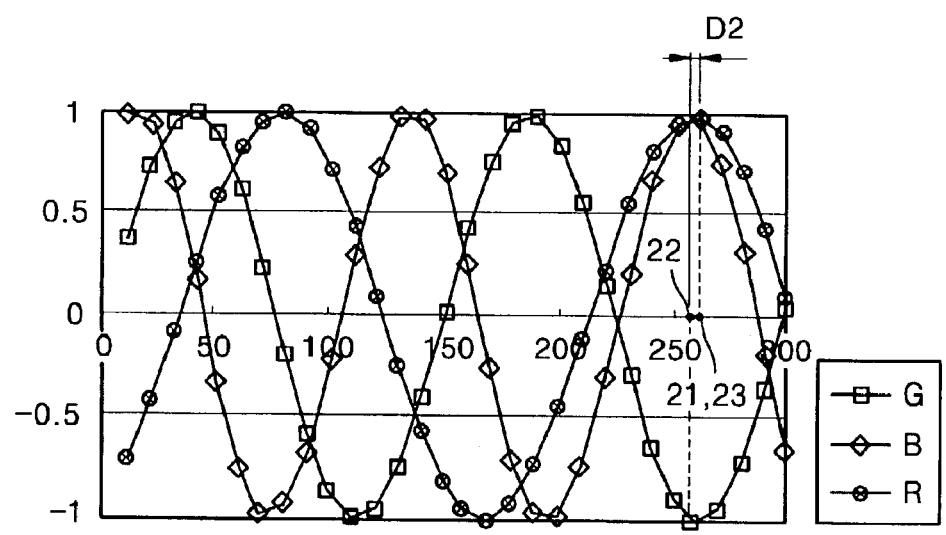
Figure 3F:
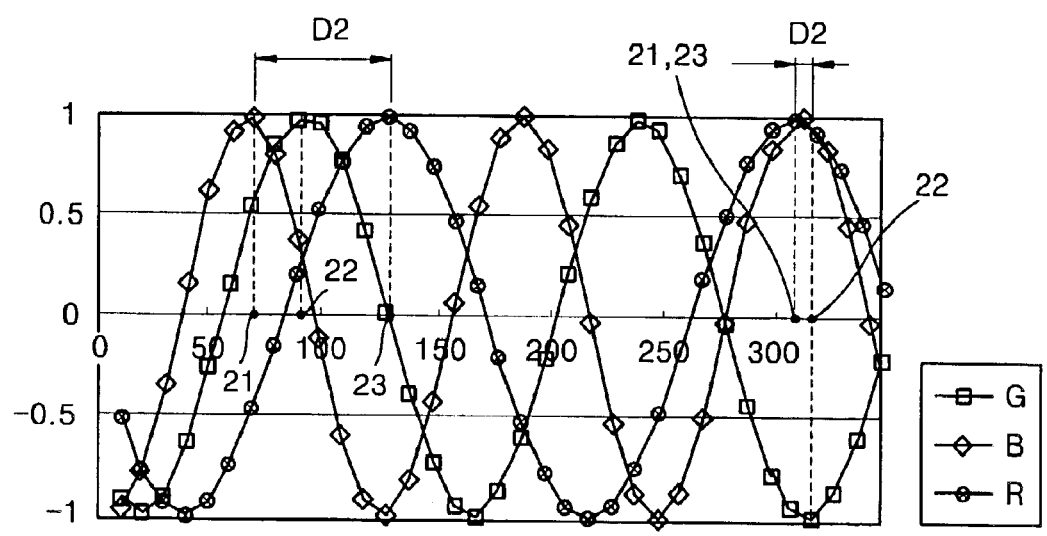

Specifically, FIG. 3A is a graph illustrating a change in luminance depending on a change in d(HTL) in the case where d(ITO) is 300 nm, FIG. 3B is a graph illustrating a change in luminance depending on a change in d(HTL) in the case where d(ITO) is 250 nm, FIG. 3C is a graph illustrating a change in luminance depending on a change in d(HTL) in the case where d(ITO) is 200 nm, FIG. 3D is a graph illustrating a change in luminance depending on a change in d(HTL) in the case where d(ITO) is 150 nm, FIG. 3E is a graph illustrating a change in luminance depending on a change in d(HTL) in the case where d(ITO) is 100 nm, and FIG. 3F is a graph illustrating a change in luminance depending on a change in d(HTL) in the case where d(ITO) is 50 nm, respectively.

The ordinate denotes relative values of luminance and the abscissa denotes d(HTL). Each graph illustrates a change in luminance depending on a change in d(HTL) according to the wavelengths of three primary colors, i.e., red (R) with a center wavelength ranging from 600 nm to 650 nm, green (G) with a center wavelength ranging from 500 nm to 550 nm, and blue (B) with a center wavelength ranging from 440 nm to 490 nm. The refractive index of an organic thin film 10, the refractive index of a transparent electrode 2 made from ITO, and the refractive index of a substrate 1 are the same as those shown in Table 1.

Let the d(HTL) with a maximum or minimum of luminance be a center wavelength, the peak_d(HTL) of each of three primary colors of red, green and blue be a red peak_d(HTL) (21), a green peak_d(HTL) (22) and a blue peak_d(HTL) (23). Referring to FIG. 3A, when the l2 is set such that a thickness distribution D(EML) according to colors of red, green and blue, corresponding to a difference between the maximum and minimum values among the red peak_d(HTL) (21), the green peak d(HTL) (22) and the blue peak_d(HTL) (23), is within the range of 30 nm, it equals the sum of thickness of the electron transport layer 7 and thickness of the light emitting layer 6, at which a change in luminance depending on changes in thickness becomes a minimum for all of the three colors of red, green and blue.

As illustrated in FIG. 3B, when the red peak_d(HTL) (21), the green peak_d(HTL) (22) and the blue peak_d (HTL) (23) are all within in the range of about 30 nm, constructive interference or destructive interference occurs with all colors of red, green and blue, so that the luminance of each color reaches a maximum or minimum value. That is to say, when the geometric thickness of the transparent electrode 2 is 250 nm and the geometric thickness of the hole transport layer 5 is 100 nm, constructive interference occurs with red and blue light, and destructive interference occurs with green light, so that the luminance becomes a minimum. Thus, since the thickness d(HTL) is set differently from an intended thickness, even if there is a difference in d(HTL), a difference in the luminance can be minimized for all colors of red, green and blue.

Also, when the d(HTL) is around 50 nm, as illustrated in FIG. 3A, when the d(HTL) is around 100 nm, as illustrated in FIG. 3B, when the d(HTL) is around 150 nm and 80 nm, as illustrated in FIG. 3C, when the d(HTL) is around 210 nm and 130 nm, as illustrated in FIG. 3D, when the d(HTL) is about 260 nm, as illustrated in FIG. 3E, and when the d(HTL) is about 310 nm, as illustrated in FIG. 3F, constructive interference or destructive interference occurs with red, green and blue, so that the luminance becomes a maximum or a minimum. Thus, since the thickness d(HTL) is set to have the maximum or minimum of luminance, even if there is a difference in d(HTL), a difference in the luminance can be minimized for all colors of red, green and blue.

Table 2 shows changes in luminance relative to a change in thickness of a thin film, i.e., ±5 nm, when the d(HTL), i.e., the geometric thickness of the hole transport layer 5, is 80 nm and 130 nm, in the case where the d(ITO), i.e., the geometric thickness of the transparent electrode 2, is 150 nm. Here, color characteristics of blue are optimized when d(HTL)=80 nm, and the difference in luminance of all colors, depending on a thickness difference, is minimized when d(HTL)=130 nm.

TABLE 2

| D(HTL) | Color | Difference in luminance |
|---|---|---|
| Example (130 nm) | R | 18% |
|  | G | 6% |
|  | B | 37% |
| Comparative Example (80 nm) | R | 82% |
|  | G | 64% |
|  | B | 18% |

As shown in Table 2, in contrast with a Comparative Example in which a difference in luminance is minimized only when the color is blue, differences in luminance for all colors of R, G and B are minimized in the Example of the present invention.

An organic EL device according to another embodiment of the present invention includes a substrate 1, a transparent electrode 2, a hole transport layer 5, a light emitting layer 6, an electron transport layer 7 and a cathode 8, sequentially stacked.

Here, the same reference numerals as those illustrated in the above drawings denote substantially the same functional elements, and a detailed explanation thereof will not be given.

When the l1 with a maximum of luminance is set to l1 for each color, i.e., the red peak_l1 (11), the green peak_l1 (12) and the blue peak_l1 (13), and when the l2 with a maximum or minimum of luminance is set such that a thickness distribution D(HTL) according to colors of red, green and blue, corresponding to a difference between the maximum and minimum values among the red peak_d(HTL) (21), the green peak_d(HTL) (22) and the blue peak_d(HTL) (23), is within the range of 30 nm, both of the l1 and l2 equal the sum of a thickness at which a change in luminance depending on changes in thickness becomes a minimum for all of the three colors of red, green and blue.

In this case, $L1=(nd)1+(nd)2=(2m+1)\times\lambda/4$ and $L2=(nd)3+(nd)4=(m+1)\times\lambda/2$ (m is a positive integer inclusive of 0).

As described above, in the organic EL device according to the embodiments of the present invention, the thickness of an organic thin film is set such that a difference in luminance according to three primary colors of red, green and blue depending on a thickness change of the organic thin film becomes smaller, in consideration of an optical interference effect, thereby optimizing distribution characteristics of the three primary colors.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic EL device comprising:

a transparent substrate;

a transparent electrode;

a hole transport layer;

a light emitting layer;

an electron transport layer; and a cathode, wherein the layers are sequentially stacked, and wherein with a sum of a geometric thickness of the hole transport layer and a geometric thickness of the transparent electrode being denoted by l2, with the geometric thickness of the hole transport layer being denoted by d(HTL), and with the d(HTL) resulting in a maximum or minimum of luminance being denoted by a peak_d(HTL), the l2 is set such that a thickness distribution according to colors of red, green and blue at the peak_d(HTL), is within the range of 30 nm.

2. The organic EL device of claim 1, wherein with a corresponding peak_d(HTL) or each of three primary colors of red, green and blue are a red peak_d(HTL), a green peak_d(HTL), and a blue peak_d(HTL), respectively, the thickness distribution according to colors of red, green and blue at the peak_d(HTL) corresponds to a difference between maximum and minimum values among the red peak_d(HTL), the green peak_d(HTL) and the blue peak_d(HTL).

3. The organic EL device of claim 2, wherein with a sum of an optical thickness of the hole transport layer and an optical thickness of the transparent electrode being denoted by L2, and with the optical thickness of the hole transport layer and the optical thickness of the transparent electrode being denoted by (nd)3 and (nd)4, respectively, and m is a positive integer inclusive of 0, the following equation is implemented:

$$L2=(nd)3+(nd)4=(m+1)\times\lambda/2.$$

4. The organic EL device of claim, 1, wherein with a sum of an optical thickness of the hole transport layer and an optical thickness of the transparent electrode being denoted by L2, and with the optical thickness of the hole transport layer and the optical thickness of the transparent electrode being denoted by (nd)3 and (nd)4, respectively, and m is a positive integer inclusive of 0, the following equation is implemented:

$$L2=(nd)3+(nd)4=(m+1)\times\lambda/2.$$

5. The organic EL device of claim 1, wherein the substrate is made from glass, quartz or organic polymer compounds.

6. The organic EL device of claim 1, wherein the substrate is made from a transparent dielectric material having a work function of at least 4 electron volts.

7. The organic EL device of claim 6, wherein the substrate is made from ITO or IZO.

8. The organic EL device of claim 1, wherein the transparent electrode is formed on the substrate by deposition of transparent material.

9. The organic EL device of claim 1, wherein the transparent electrode is formed on the substrate by sputtering transparent material.

10. The organic EL device of claim 1, wherein the cathode is made from metals, alloys and electrically conductive compounds having a low work function of less than 4 eV.

11. The organic EL device of claim 10, wherein the metals are made from sodium, magnesium, aluminium or lithium.

12. The organic EL device of claim 1, wherein the cathode is formed on the electron transporting layer in the form of a thin film by deposition or sputtering.

13. The organic EL device of claim 1, wherein when the red peakl_d(HTL), the green peakl_d(HTL) and the blue peakl_d(HTL) are all within in the range of about 30 nm, constructive interference or destructive interference occurs with all colors of red, green and blue, so that a luminance of each color reaches a maximum or minimum value.

14. The organic EL device of claim 1, wherein when the geometric thickness of the transparent electrode is 250 nm and the geometric thickness of the hole transport layer is 100 nm, constructive interference occurs with red and blue and destructive interference occurs with green, so that a corresponding luminance becomes a minimum.

15. An organic EL device comprising:

a substrate;

a transparent electrode;

a hole transport layer;

a light emitting layer;

an electron transport layer; and a cathode, wherein the layers are sequentially stacked, and wherein with a sum of a geometric thickness of the electron transport layer and a geometric thickness of the light emitting layer being denoted by l1, with corresponding l1 resulting in a maximum of luminance being denoted by a peak_l1, with a sum of a geometric thickness of the hole transport layer and a geometric thickness of the transparent electrode being denoted by l2, with the geometric thickness of the hole transport layer being denoted by d(HTL), and with the d(HTL) resulting in a maximum or minimum of luminance being denoted by a the peak_d(HTL), the l1 is set to have the maximum of luminance and the l2 is set such that a thickness distribution according to colors of red, green and blue at the peak_d(HTL) is within the range of 30 nm, respectively.

16. The organic EL device of claim 15, wherein corresponding l1 for each color, including three primary colors of red, green and blue, are a red peak_l1, a green peak_l1, and a blue peak_l1, respectively, and with a corresponding peak_d(HTL) for each of the three primary colors of red, green and blue being a red peak_d(HTL), a green peak_d (HTL), and a blue peak d(HTL), respectively, the thickness distribution according to colors of red, green and blue at the peak_d(HTL) corresponds to a difference between maximum and minimum values among the red peak_d(HTL), the green peak_d(HTL), and the blue peak d(HTL).

17. The organic EL device of claim 16, wherein with a sum of an optical thickness of the electron transport layer and an optical thickness of the light emitting layer being denoted by L1, the optical thickness of the electron transport layer is denoted by $(nd)1$, the optical thickness of the light emitting layer is denoted by $(nd)2$, and with a sum of an optical thickness of the hole transport layer and an optical thickness of the transparent electrode being denoted by L2, the optical thickness of the hole transport layer is denoted by $(nd)3$, the optical thickness of the transparent electrode is denoted by $(nd)4$, and m is a positive integer inclusive of 0, the following equation is implemented:

$$L1=(nd)1+(nd)2=(2m+1)\times\lambda/4 \text{ and } L2=(nd)3+(nd)4=(m+1)\times\lambda/2.$$

18. The organic EL device of claim 16, wherein when the red peak_l1, the green peak_l1 and the blue peak_l1 are 90 nm, 75 nm and 60 nm, respectively, constructive interference occurs to all colors of red, green and blue, so that a luminance of each color reaches a maximum value.

19. The organic EL device of claim 15, wherein with a sum of an optical thickness of the electron transport layer and an optical thickness of the light emitting layer being denoted by L1, the optical thickness of the electron transport layer is denoted by $(nd)1$, the optical thickness of the light emitting layer is denoted by $(nd)2$, and with a sum of an optical thickness of the hole transport layer and an optical thickness of the transparent electrode being denoted by L2, the optical thickness of the hole transport layer is denoted by $(nd)3$, the optical thickness of the transparent electrode is denoted by $(nd)4$, and m is a positive integer inclusive of 0, the following equation is implemented:

$$L1=(nd)1+(nd)2=(2m+1)\times\lambda/4$$

and $$L2=(nd)3+(nd)4=(m+1)\times\lambda/2.$$

* * * * *

UNITED STATES PATENT AND TRADEMARK OFFICE
CERTIFICATE OF CORRECTION

PATENT NO. : 6,906,457 B2
DATED : June 14, 2005
INVENTOR(S) : Young Woo Song et al.

It is certified that error appears in the above-identified patent and that said Letters Patent is hereby corrected as shown below:

Column 8,
Line 26, change "or" to -- for --.

Signed and Sealed this

Twenty-seventh Day of September, 2005

JON W. DUDAS
*Director of the United States Patent and Trademark Office*